(12) United States Patent
Ozaki et al.

(10) Patent No.: US 9,203,170 B2
(45) Date of Patent: Dec. 1, 2015

(54) PIN HEADER

(71) Applicant: YAZAKI CORPORATION, Minato-ku, Tokyo (JP)

(72) Inventors: Shinya Ozaki, Makinohara (JP); Takanori Kitajo, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/473,399

(22) Filed: Aug. 29, 2014

(65) Prior Publication Data

US 2015/0064974 A1 Mar. 5, 2015

(30) Foreign Application Priority Data

Aug. 30, 2013 (JP) .................................. 2013-178860

(51) Int. Cl.
*H01R 12/00* (2006.01)
*H01R 12/71* (2011.01)
*H05K 1/14* (2006.01)
*H01R 12/52* (2011.01)
*H01R 12/58* (2011.01)
*H01R 12/70* (2011.01)

(52) U.S. Cl.
CPC ............ *H01R 12/712* (2013.01); *H01R 12/523* (2013.01); *H05K 1/14* (2013.01); *H01R 12/58* (2013.01); *H01R 12/7052* (2013.01)

(58) Field of Classification Search
CPC ..................................................... H01R 12/585
USPC .............................................. 439/75, 74, 76.2
See application file for complete search history.

(56) References Cited

U.S. PATENT DOCUMENTS

| 4,664,458 | A | * | 5/1987 | Worth ............................. 439/82 |
| 7,687,715 | B2 | * | 3/2010 | Sano ............................. 174/88 R |
| 8,403,682 | B2 | * | 3/2013 | Motoda ............................. 439/74 |
| 8,475,182 | B2 | * | 7/2013 | Li et al. ............................. 439/74 |
| 2009/0020332 | A1 | | 1/2009 | Sano |
| 2015/0011114 | A1 | * | 1/2015 | Endo et al. .................... 439/449 |

FOREIGN PATENT DOCUMENTS

| JP | 7-297562 A | 11/1995 |
| JP | 2009-26464 A | 2/2009 |

* cited by examiner

*Primary Examiner* — Phuong Dinh
(74) *Attorney, Agent, or Firm* — Sughrue Mion, PLLC (57) ABSTRACT

A pin header includes a connection pins and a pin holder. The connection pins includes one end to be connected to a first circuit board and the other end to be connected to a second circuit board which is positioned to form a given gap between the first circuit board and the second circuit board. The pin holder includes a holder body which holds centers of side faces of the plurality of connection pins, and a projection holder which includes a first projecting portion projecting from the holder body toward a side of the one end of the connection pins, and a second projecting portion projecting from the holder body toward a side of the other end of the connection pins. A projection length of the first projecting portion is equal to a projection length of the second projecting portion.

8 Claims, 9 Drawing Sheets

PIN HEADER

CROSS REFERENCE TO RELATED APPLICATION

This application is based on Japanese Patent Applications No. 2013-178860 filed on Aug. 30, 2013, the contents of which are incorporated herein by reference.

BACKGROUND OF THE INVENTION

1. Technical Field

The present invention relates to a pin header, and more particularly to a pin header for connecting a plurality of circuit boards together.

2. Background Art

Conventionally, an electrical junction box which is mounted in an automobile houses a printed circuit board for controlling various electronic apparatuses mounted in the automobile. With a rapid increase in number of electronic apparatuses, recently, some electrical junction boxes house a printed circuit board for distributing electric power to various electronic apparatuses, and a further printed circuit board for controlling the electronic apparatuses. Connection pins are used for connecting such a plurality of printed circuit boards together.

Figure 8:
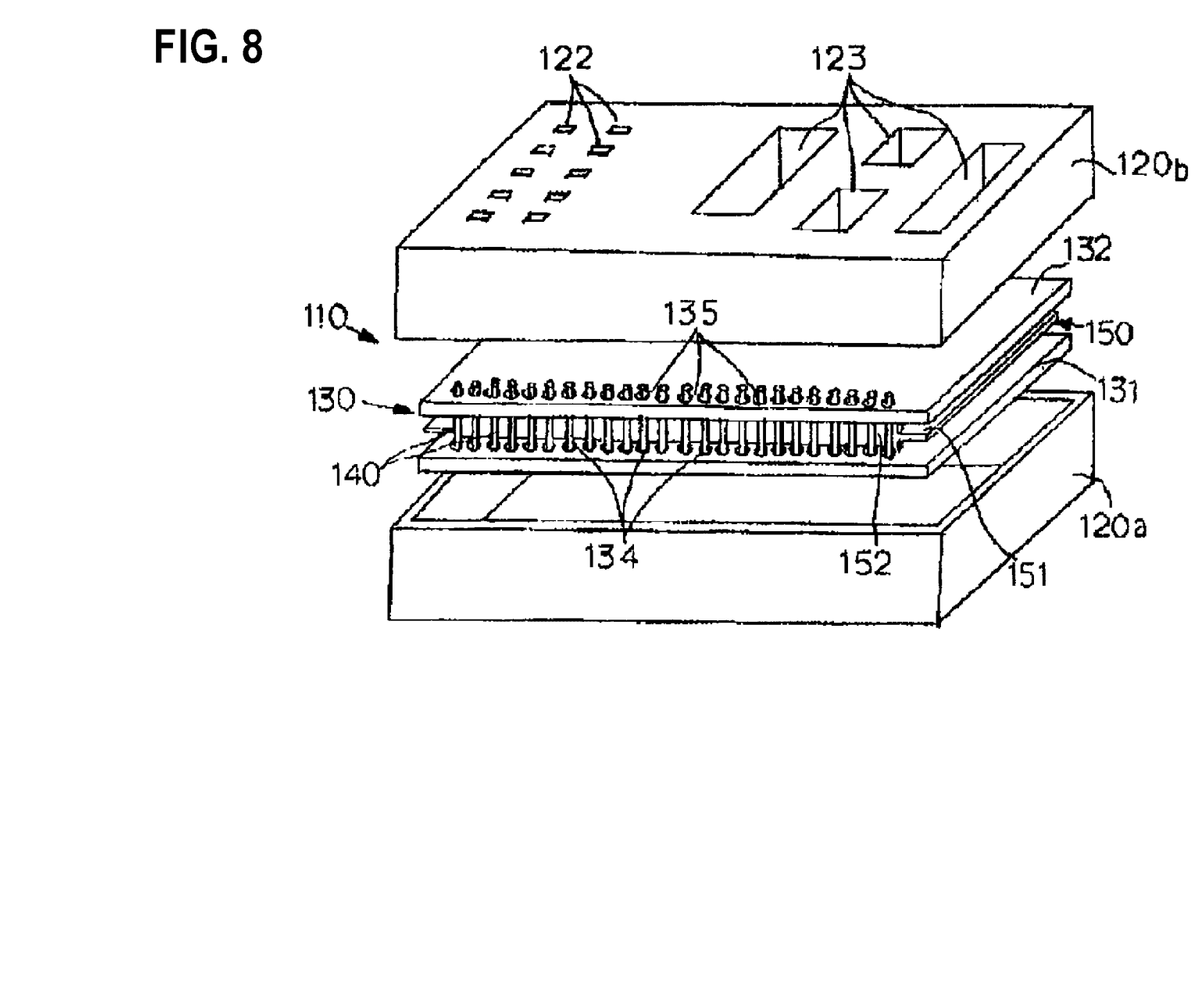
FIG. 8 is a perspective view showing Conventional example 1.

JP-A-7-297562 (Conventional example 1) discloses a configuration where, as shown in FIG. 8, PCBs 131, 132 are stacked together via an insulation separator 150, many connection pins 140 are inserted into and passed through many through holes 134, 135 which are formed in edge portions of the PCBs 131, 132, and the passed end portions of the connection pins 140 are soldered to integrate electrically and mechanically the PCBs 131, 132 with each other.

Figure 9:
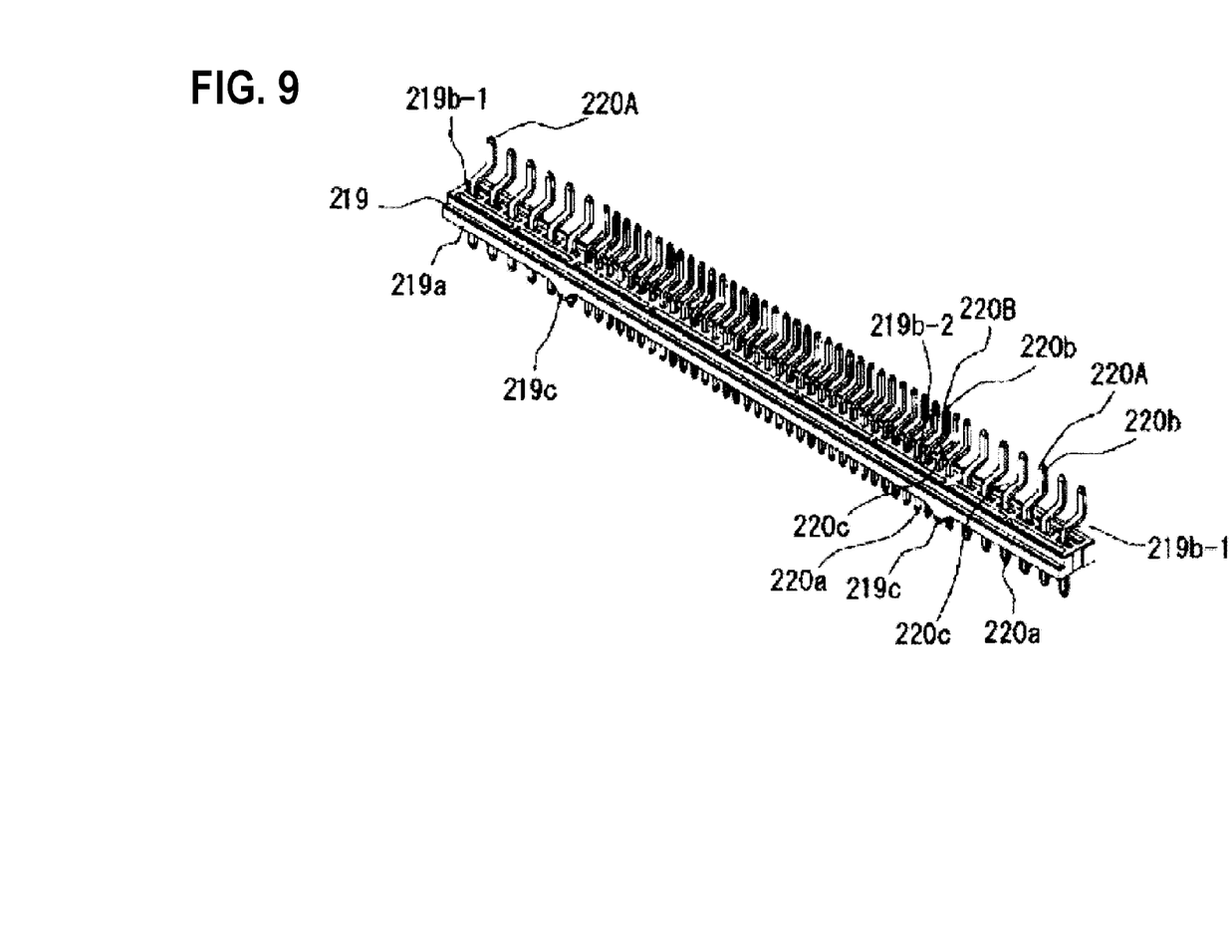
FIG. 9 is a diagram showing a terminal member which is fixed to a terminal support base in Conventional example 2.

JP-A-2009-026464 (Conventional example 2) discloses a configuration where, as shown in FIG. 9, a first printed circuit board (not shown) and a second printed circuit board (not shown) are stacked together via a spacer (not shown), a plurality of terminal members 220 are then inserted into a plurality of terminal holes (not shown) of the first and second printed circuit boards, and soldered and fixed to a terminal support base 219, and bent portions 220c are disposed in the terminal members 220, thereby relaxing a load applied in the case where the first and second printed circuit boards are installed.

SUMMARY

In the connection pins 140 disclosed in JP-A-7-2975621, in order to connect the PCBs 131, 132 with each other, however, the connection pins 140 must be one by one inserted into and soldered to the through holes 134, 135 of the PCBs 131, 132. Therefore, the work of connecting the connection pins 140 to the PCBs 131, 132 is cumbersome. In each of the terminal members 220 disclosed in JP-A-2009-026464, one end which is in the vicinity of the bent portion 220c is bendingly formed as compared with the other end, and, when the insertion end of the terminal member 220 is to be connected to the first and second printed circuit boards, the worker therefore must check on which side of the member the end in the vicinity of the bent portion 220c is located. Consequently, the work is cumbersome.

The invention has been conducted in view of the above-discussed circumstances. It is an object of the invention to provide a pin header which allows a plurality of connection pins to be integrally connected to first and second circuit boards without requiring a check of insertion end portions of the connection pins.

(1) According to an aspect of the invention, a pin header includes a connection pins and a pin holder. The connection pins includes one end to be connected to a first circuit board and the other end to be connected to a second circuit board which is positioned to form a given gap between the first circuit board and the second circuit board. The pin holder includes a holder body which holds centers of side faces of the plurality of connection pins, and a projection holder which includes a first projecting portion projecting from the holder body toward a side of the one end of the connection pins, and a second projecting portion projecting from the holder body toward a side of the other end of the connection pins. A projection length of the first projecting portion is equal to a projection length of the second projecting portion.

According to the configuration of (1), when the lengths of the connection pins from the holder body are made equal to each other and the lengths of the projection holder from the holder body are made equal to each other, fixation of the pin header to the first circuit board can be performed without checking the direction of insertion end portions of the pin header.

(2) In the pin header of (1), the pin holder includes a plurality of the projection holders, the holder body includes insertion holes into which the connection pins are inserted, and the projection holders are placed symmetrically about a center of a surface of the holder body where the insertion holes are formed.

According to the configuration (2), irrespective of whether the one ends of the pin header are connected to the first circuit board or the other ends are connected to the first circuit board, butted positions of the connection pins against the first circuit board are always set to predetermined positions.

(3) In the pin header of (1) or (2), end portions of the first projecting portion and the second projecting portion are formed into a spherical shape.

According to the configuration (3), the projection holder can make point contact with the first circuit board, whereby the contact area of the first circuit board with which the projection holder is to be in contact can be reduced.

According to the invention, the plurality of connection pins can be integrally connected to the first and second circuit boards without checking the direction in which the connection pins are to be inserted.

DESCRIPTION OF EMBODIMENTS

First Embodiment

Hereinafter, an electrical junction box 1 to which a pin header 2 of a first embodiment of the invention is applied will be described with reference to the drawings.

Figure 1:
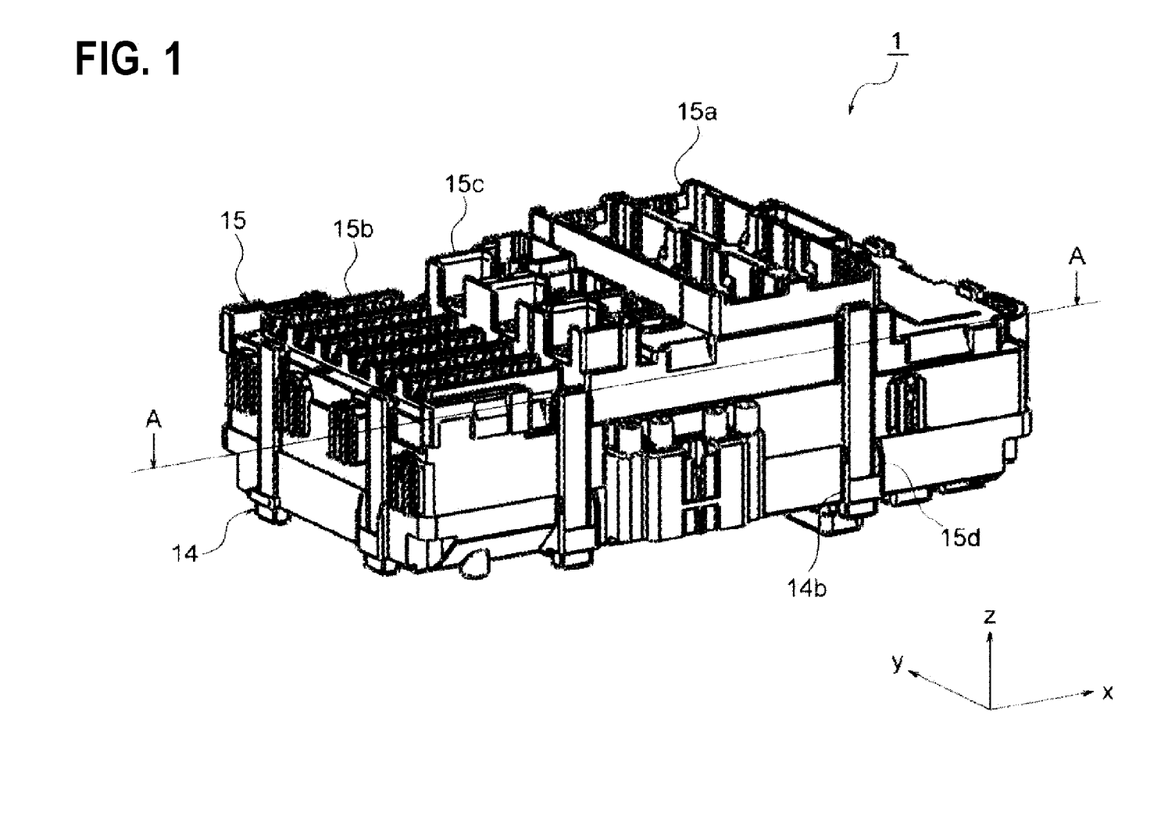
FIG. 1 is a perspective view of an electrical junction box to which a pin header of a first embodiment is applied.
Figure 2:
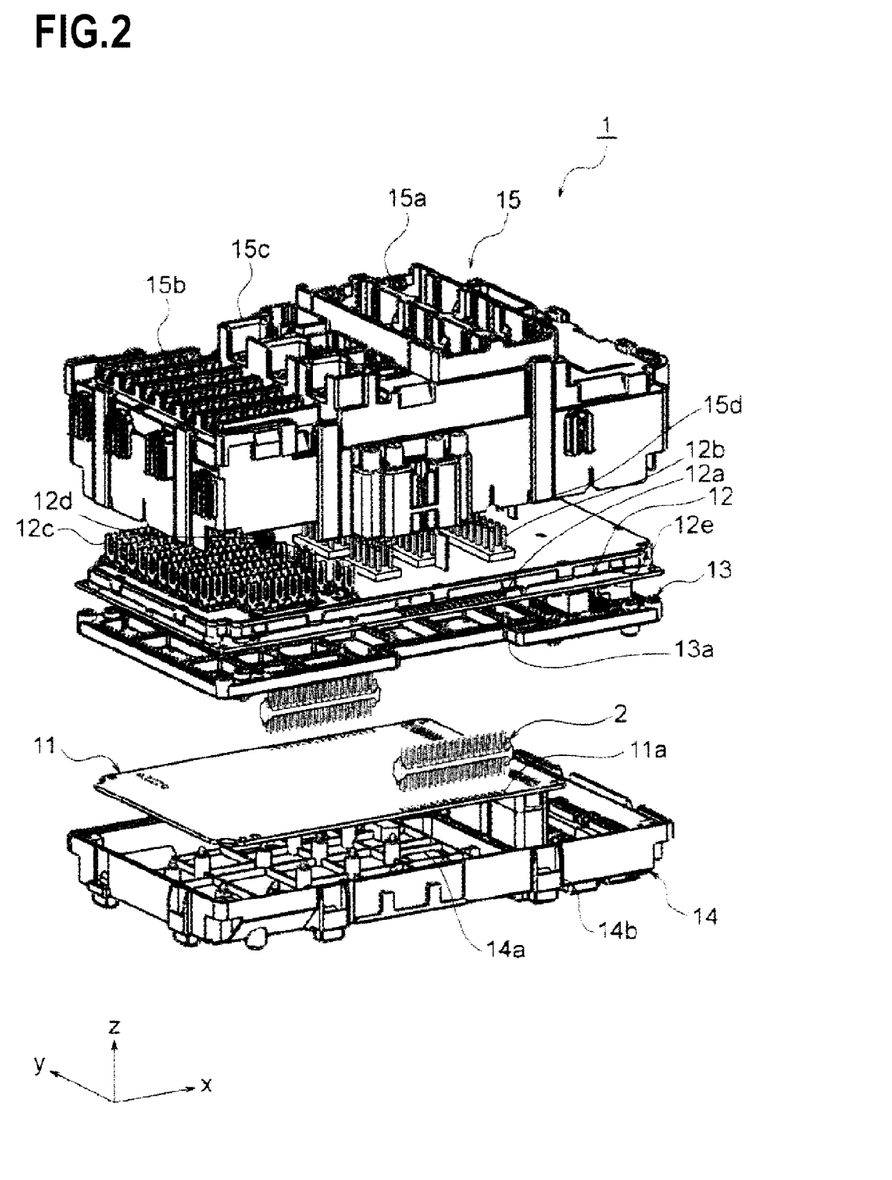
FIG. 2 is an exploded view of the electrical junction box of FIG. 1.

FIG. 1 is a perspective view of the electrical junction box 1 to which the pin header 2 of the first embodiment is applied, and FIG. 2 is an exploded view of the electrical junction box 1 of FIG. 1.

The longitudinal direction of the electrical junction box 1 is set as the x-axis, the width direction of the electrical junction box 1 is set as the y-axis, and the height direction of the electrical junction box 1 is set as the z-axis.

As shown in FIGS. 1 and 2, the electrical junction box 1 has: a first circuit board 11; a second circuit board 12 which is positioned while forming a predetermined gap with respect to the first circuit board 11; an insulating plate 13 which is positioned between the first circuit board 11 and the second circuit board 12; the pin header 2 which integrally connects the first circuit board 11 and the second circuit board 12 together; and lower and upper covers 14, 15 which house the first circuit board 11, the second circuit board 12, the insulating plate 13, and the pin header 2.

The configuration of the pin header 2 will be described later.

The first circuit board 11 is a printed circuit board on which a plurality of desired patterns (not shown) for producing control signals for various electronic apparatuses mounted on a vehicle such as an automobile (electronic apparatuses constituting an air conditioner, a windshield wiper, electric windows, and the like) (not shown) are printed. As shown in FIG. 2, the first circuit board 11 has a longitudinal rectangular shape, and a plurality of through holes 11a are formed in both edge portions which extend in the longitudinal direction.

The second circuit board 12 is a printed circuit board on which a plurality of desired patterns (not shown) for distributing electric currents to the various electronic apparatus are printed. As shown in FIG. 2, the second circuit board 12 has a longitudinal rectangular shape which is identical with the shape of the first circuit board 11, and a plurality of through holes 12a are formed in both edge portions which extend in the longitudinal direction, correspondingly with the through holes 11a of the first circuit board 11. On the upper surface (surface on the side of the upper cover 15) of the second circuit board 12, formed are: thin plate-like circuit board terminals 12b which are to be connected to connectors (connection terminals of the electronic apparatuses) (not shown); so-called tuning fork type circuit board terminals 12c each of which has a pair of pressure contact pieces, and which is to be connected to a fuse (device which, when a current larger than a rated current flows, melts down to interrupt the current flow) (not shown); and so-called tuning fork type circuit board terminals 12d each of which is to be connected to a relay (device which controls ON/OFF of a current flow) (not shown). A terminal mounting plate 12e which holds the circuit board terminals 12b, 12c, 12d, and which is made of a nonconductive synthetic resin is further formed on the upper surface of the second circuit board.

As shown in FIG. 2, the insulating plate 13 is a plate member which is made of a nonconductive synthetic resin, and which has a lattice-like shape. A pair of cutaway portions 13a which are inwardly cut away are formed in the longitudinal side surfaces of the insulating plate 13, respectively. The cutaway portions 13a formed in the insulating plate 13 can prevent the insulating plate 13 from, when the insulating plate 13 is interposed between the first circuit board 11 and the second circuit board 12, being situated between the through holes 11a of the first circuit board 11 and the through holes 12a of the second circuit board 12.

The thickness of the insulating plate 13 is larger than the length of projection holders 24 (which will be described later) of the pin header 2. This configuration enables the insulating plate 13 to hold the second circuit board 12 in a state where the second circuit board 12 is stabilized with respect to the first circuit board 11.

As shown in FIG. 2, the lower cover 14 is made of a nonconductive synthetic resin, and has a container shape in which the upper surface is opened. A plurality of supporting projections 14a which support the first circuit board 11 are formed on the inner bottom surface of the lower cover 14. An engaged portion 14b is formed in each of the right, left, front, and rear side surfaces of the lower cover 14.

As shown in FIG. 2, the upper cover 15 is made of a nonconductive synthetic resin, and covers the opened upper portion of the lower cover 14. In the upper cover 15, a connector housing portion 15a, fuse housing portion 15b, and relay housing portion 15c which are passed through the cover in the vertical direction (z-axis direction) are formed. The connector housing portion 15a, the fuse housing portion 15b, and the relay housing portion 15c are located correspondingly with the circuit board terminals 12b, 12c, 12d, respectively. An engaging portion 15d which is to engage with the corresponding one of the engaged portions 14b is formed in each of the right, left, front, and rear side surfaces of the upper cover 15.

According to the configuration, in the electrical junction box 1 to which the pin header 2 of the first embodiment is applied, connectors, fuses, and relays are housed in the connector housing portion 15a, fuse housing portion 15b, and relay housing portion 15c which are formed in the upper cover 15, and the control circuit board for distributing electric currents to the electronic apparatuses is housed, whereby power sources for the electronic apparatuses mounted in the vehicle can be collected into the electrical junction box 1.

In the electrical junction box 1 to which the pin header 2 of the first embodiment is applied, moreover, connectors which are connected to the electronic apparatuses are connected to the circuit board terminals 12b of the second circuit board 12, and the fuses and the relays are connected to the circuit board terminals 12c, 12d of the second circuit board 12, whereby the fuses and the relays can be placed at positions adequate to distribute electric currents to the electronic apparatuses, so that electric currents can be supplied to the electronic apparatuses in a safe state.

Next, the pin header 2 of the first embodiment will be described.

Figure 3:
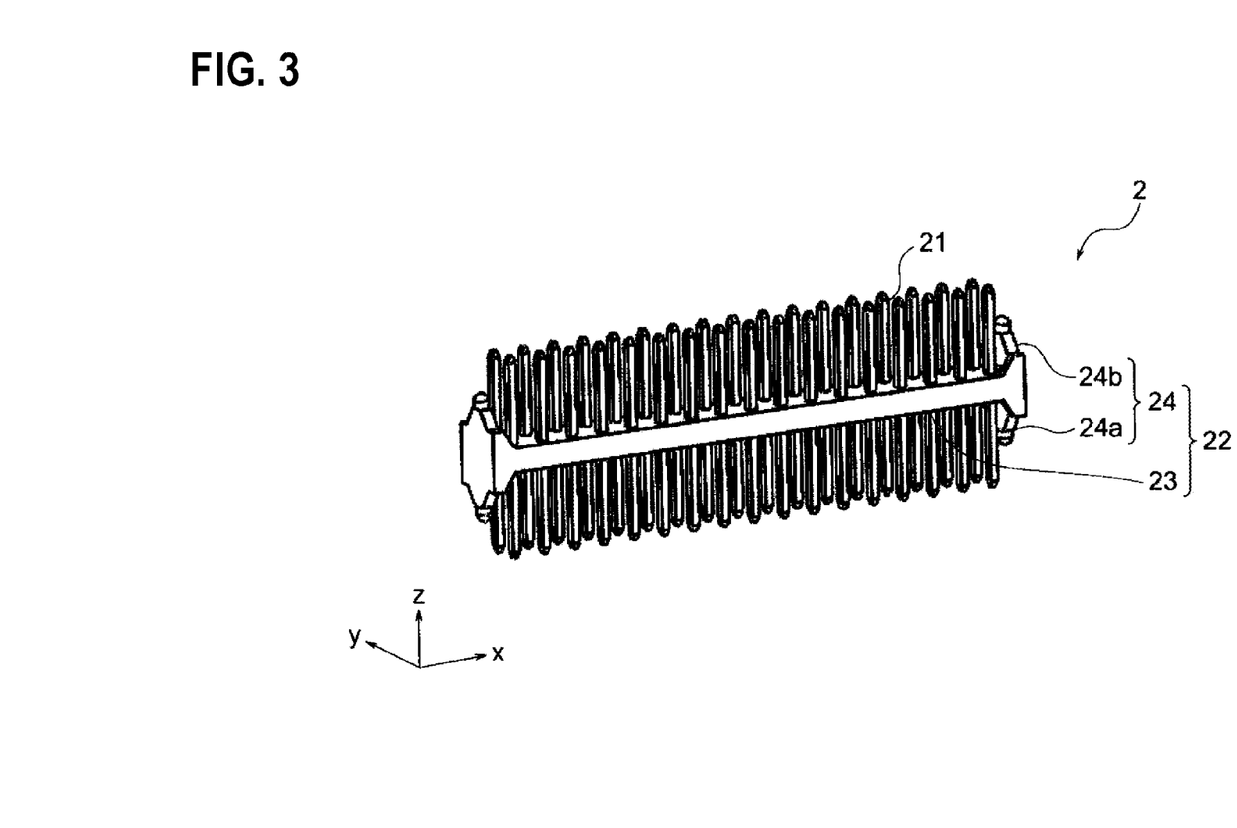
FIG. 3 is a perspective view of the pin header of the first embodiment.
Figure 4A:
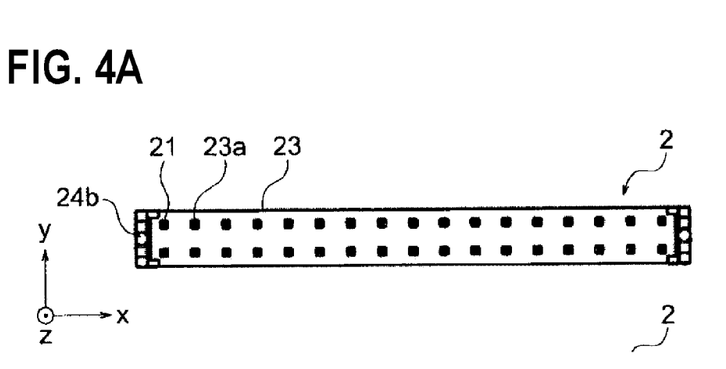
FIG. 4A is a plan view of the pin header of FIG. 3.
Figure 4B:
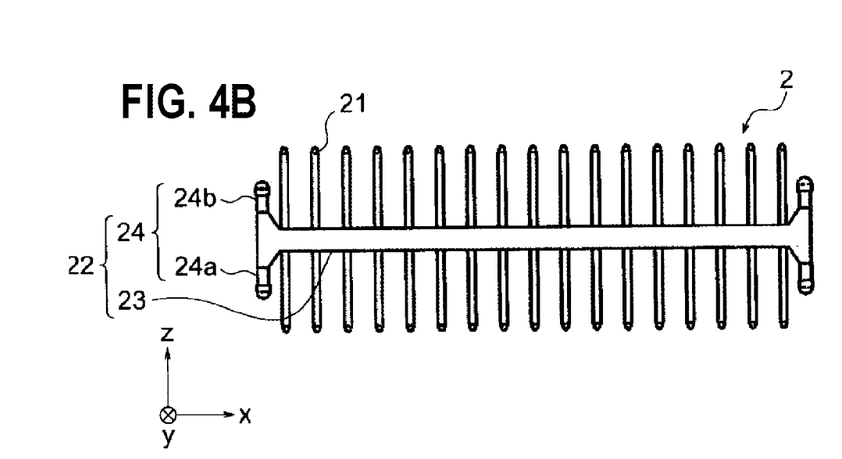
FIG. 4B is a front view of the pin header of FIG. 3.
Figure 4C:
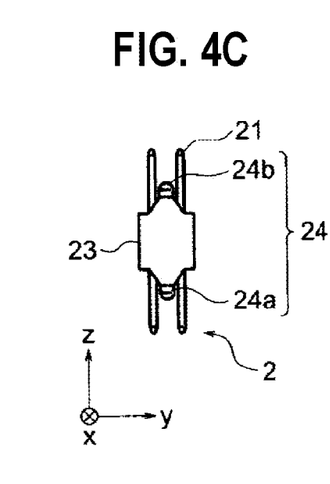
FIG. 4C is a side view of the pin header of FIG. 3.

FIG. 3 is a perspective view of the pin header 2 of the first embodiment, FIG. 4A is a plan view of the pin header 2 of FIG. 3, FIG. 4B is a front view of the pin header 2 of FIG. 3, and FIG. 4C is a side view of the pin header 2 of FIG. 3.

The coordinate system is identical with that described above.

As shown in FIGS. 3 to 4C, the pin header 2 has a plurality of connection pins 21, and a pin holder 22 which holds the centers of the side surfaces of the plurality of connection pins 21.

As shown in FIGS. 3 to 4C, the connection pins 21 are rod-like members that are formed by metal wire rods in which tin plating or the like is applied to the surface of a base material such as iron, copper, or brass, that have a square sectional shape, and that linearly extend.

As shown in FIGS. 3 to 4C, the pin holder 22 is made of a nonconductive synthetic resin, and has a holder body 23, and the pair of projection holders 24 which are secured to the both side ends in the longitudinal direction of the holder body 23, respectively.

As shown in FIGS. 3 to 4C, the holder body 23 has a rectangular parallelepiped shape, and holds the centers of the side surfaces of the plurality of connection pins 21. In the holder body 23, a plurality of insertion holes 23a which are vertically pass through are formed at predetermined intervals. The inner diameter of each of the connection pins 21 is slightly smaller than the outer circumferential diameter of each of the connection pins 21. When the connection pins 21 are inserted, the side surfaces of the connection pins 21 are constricted, and the connection pins 21 are fixed at arbitrary positions.

As shown in FIGS. 3 to 4C, each of the protection holders 24 has a first projecting portion 24a which downward projects from the holder body 23 (projects toward the side of one ends of the connection pins 21), and a second projecting portion 24b which is equal in projection length to the first projecting portion 24a, and which upward projects from the holder body 23 (projects toward the side of the other ends of the connection pins 21).

According to the configuration, in the pin header 2 of the embodiment, a length of a portion of the connection pins 21 projecting upward from the holder body 23 is equal to a length of a portion of the connection pins 21 projecting downward from the holder body 23 and a length of a portion of the projection holders 24 projecting upward from the holder body 23 is equal to a length of a portion of the projection holders 24 projecting downward from the holder body 23. In the pin header 2 of the embodiment, in both the cases where the one end of the pin header 2 is inserted into the first circuit board 11, and where the other end of the pin header 2 is inserted into the first circuit board 11, namely, the length of portions of the connection pins 21 by which the pins are passed through the first circuit board 11, and the height of the holder body 23 with respect to the first circuit board 11 can be made equal to each other.

Preferably, end portions of the first projecting portions 24a and the second projecting portions 24b may be formed into a spherical shape. According to the configuration, when the pin header 2 is fixed to the first circuit board 11, the end portions of the first projecting portions 24a, or those of the second projecting portions 24b can be fixed to the first circuit board 11 in point contact. When the projection holders 24 are fixed to the first circuit board 11 in point contact as described above, the areas where the projection holders 24 are in contact with the first circuit board 11 can be reduced, so that the desired pattern can be printed in a wider range onto the first circuit board 11. When the projection holders 24 are fixed to the first circuit board 11 in point contact, moreover, it is not necessary to process the end portions of the first and second projecting portions 24a, 24b into uniform flat surfaces, unlike the case where the end portions of the first and second projecting portions 24a, 24b are contacted and fixed in flat surfaces. Therefore, the projection holders 24 can be easily produced.

Next, a work of fixing the second circuit board 12 to the first circuit board 11 by using the pin header 2 of the embodiment will be described. As initial conditions, it is assumed that, in the pin header 2, the plurality of connection pins 21 are held by the pin holder 22 as shown in FIG. 3, the terminal mounting plate 12e and the circuit board terminals 12b, 12c, 12d are fixed to the upper surface of the second circuit board 12, and the circuit board terminals 12b, 12c, 12d are positioned by the terminal mounting plate 12e.

Figure 5A:
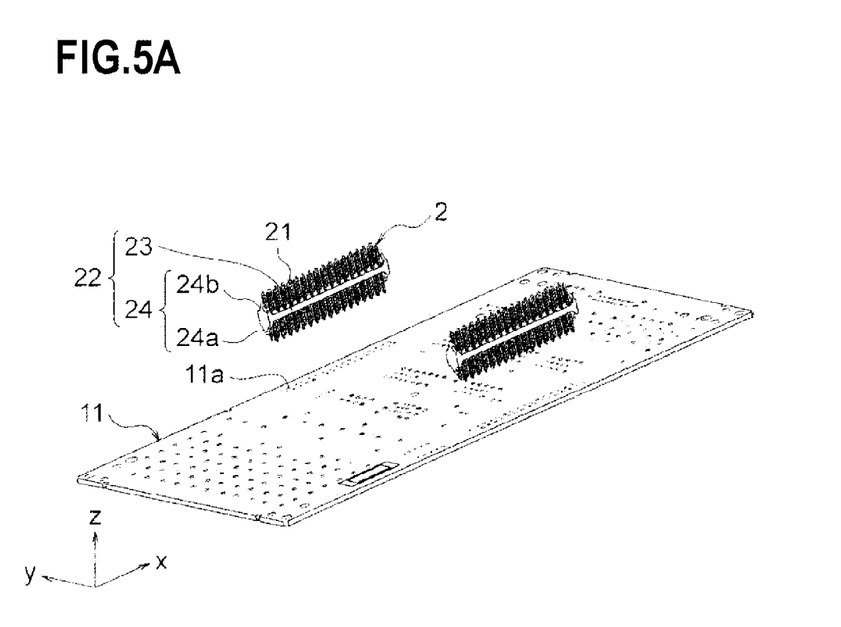
FIG. 5A is a view illustrating the operation in connection of the pin header of FIG. 3 to a first circuit board.
Figure 5B:
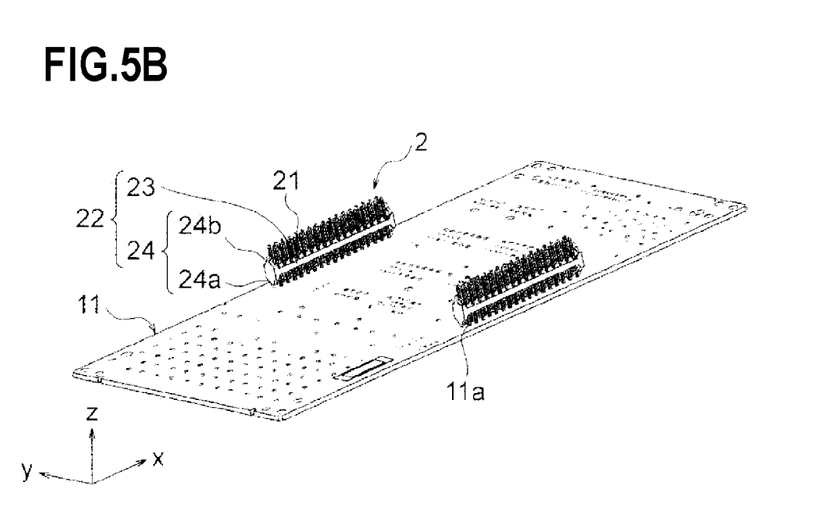
FIG. 5B is a view illustrating the operation after the pin header shown in FIG. 5A is connected to the first circuit board.
Figure 6:
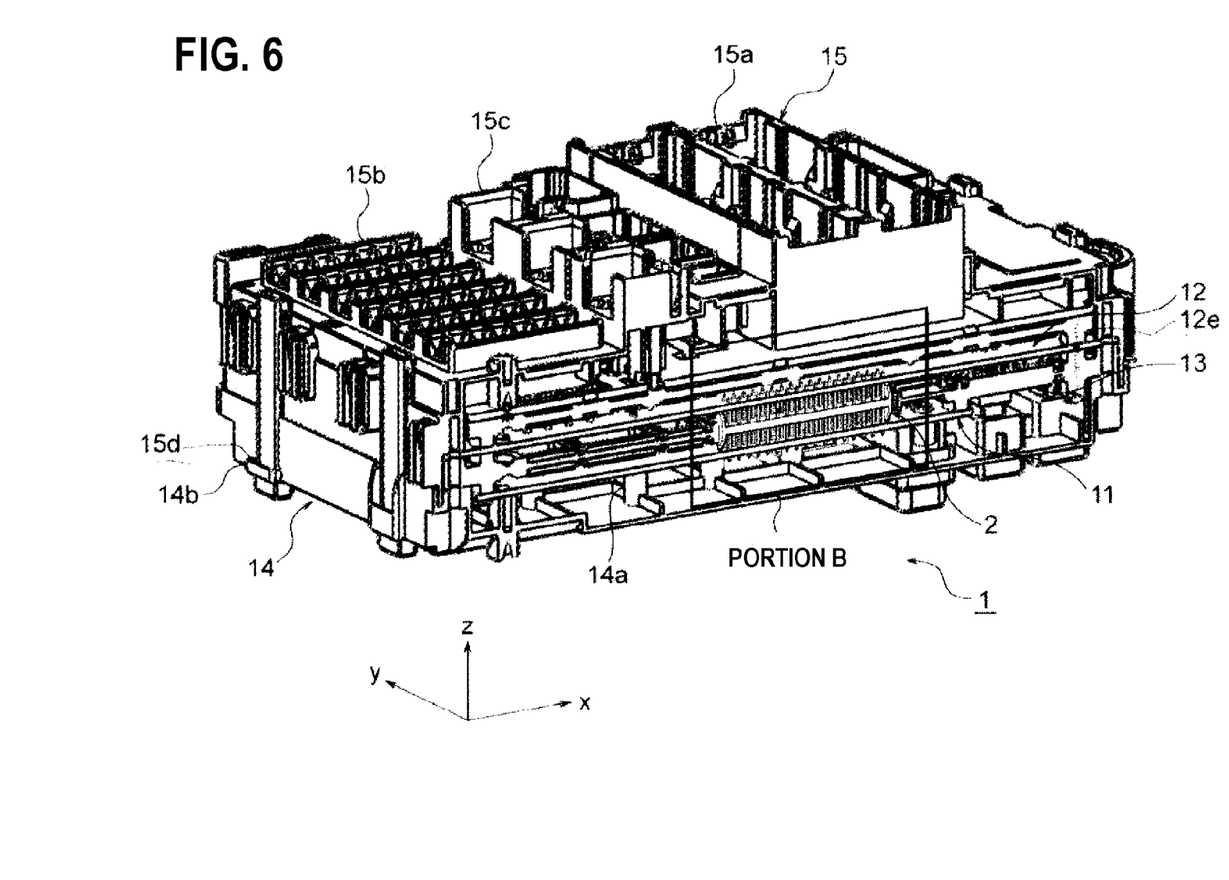
FIG. 6 is a perspective view of the electrical junction box in which the box is cut along the section A-A in FIG. 1.
Figure 7:
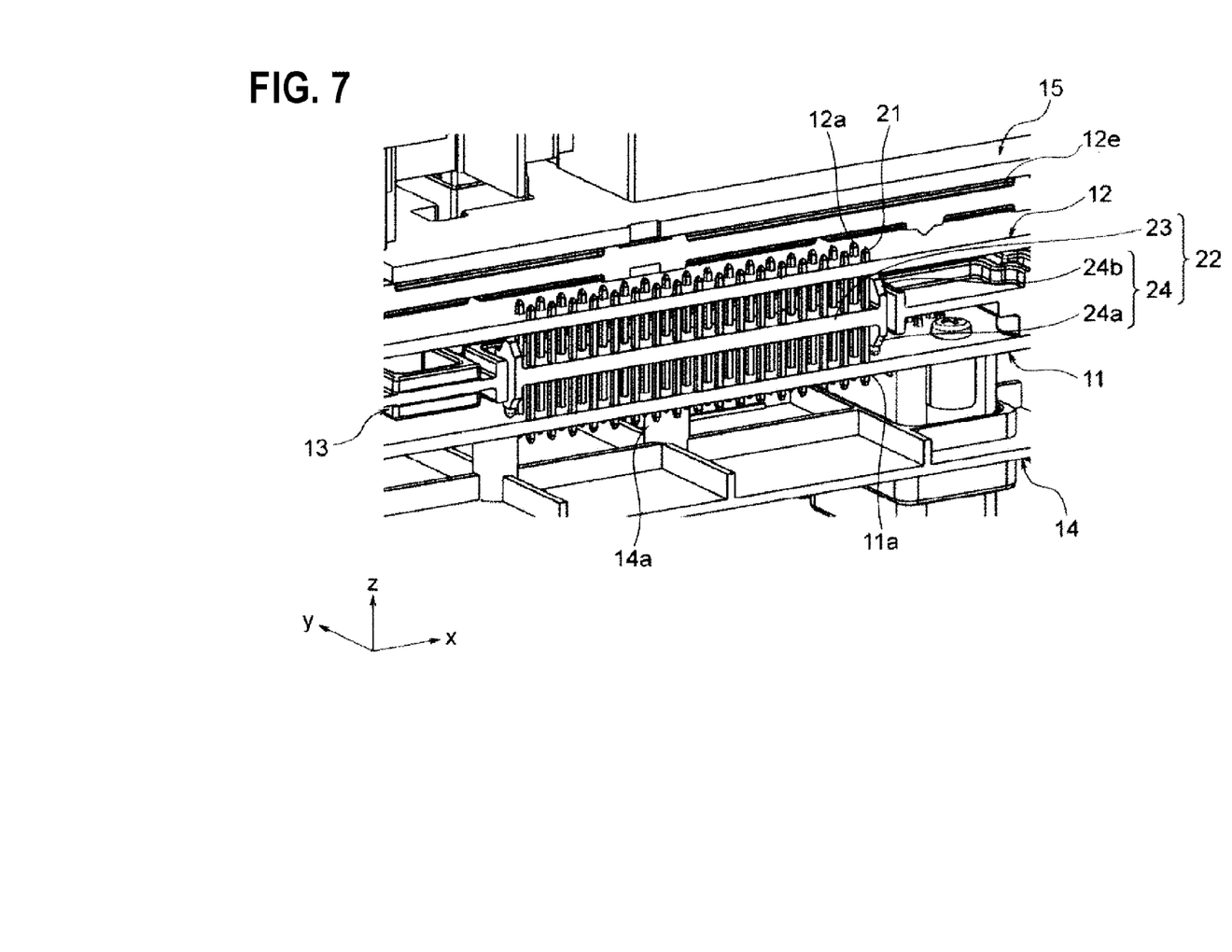
FIG. 7 is a view enlargedly showing the portion B in FIG. 6.

FIG. 5A is a view illustrating the operation in connection of the pin header 2 of FIG. 3 to the first circuit board 11, FIG. 5B is a view illustrating the operation after the pin header 2 shown in FIG. 5A is connected to the first circuit board 11, FIG. 6 is a perspective view of the electrical junction box 1 in which the box is cut along the section A-A in FIG. 1, and FIG. 7 is a view enlargedly showing the portion B in FIG. 6.

As shown in FIG. 5A, the worker aligns the pin header 2 with the plurality of through holes 11a of the first circuit board 11 supported by the supporting projections 14a.

The worker inserts one ends of the connection pins 21 of the pin header 2 into the plurality of through holes 11a of the first circuit board 11. At this time, as shown in FIG. 5B, the one ends (end portions of the first projecting portion 24a) of the projection holders 24 butt against the first circuit board 11, and the holder body 23 is held at the predetermined height with respect to the first circuit board 11. In this state, the worker solders the one ends of the connection pins 21 to the first circuit board 11, thereby fixing the pin header 2 to the first circuit board 11. Then, the worker places the insulating plate 13 on the first circuit board 11.

The worker places the second circuit board 12 on the insulating plate 13 while aligning the plurality of through holes 12a of the second circuit board 12 with the other ends of the connection pins 21 of the pin header 2. When the insulating plate 13 is placed on the second circuit board 12, the other ends the connection pins 21 are inserted into the through holes 12a of the second circuit board 12. The worker solders the insertion end portions of the connection pins 21 to fix the pair of pin headers 2 to the second circuit board 12, thereby ending the work.

The second circuit board 12 which is fixed to the first circuit board 11 as described above is installed into the lower and upper covers 14, 15 so as to be covered thereby. As a result, the electrical junction box 1 to which the pin header 2 of the embodiment is applied is produced.

As described above, when the pin header 2 of the embodiment is to be fixed the first circuit board 11, the worker can integrally fix the plurality of connection pins 21 to the first circuit board 11 without checking the insertion end portions of the pin header 2. As compared to Conventional examples 1 and 2, therefore, the work of connecting the pin header 2 to the first circuit board 11 can be simplified. Similarly, also in the work of connecting the pin header 2 to the second circuit board 12, the plurality of connection pins 21 can be integrally fixed to the second circuit board 12 without checking the insertion end portion of the pin header 2. Therefore, also the work of connecting the pin header 2 to the second circuit board 12 can be simplified.

As shown in FIGS. 6 and 7, the one and other ends of the connection pins 21 of the pin header 2 of the embodiment are fixed by soldering to the first circuit board 11 and the second circuit board 12, respectively, whereby the first and second circuit boards 11, 12 can be mechanically integrated with each other, and the first and second circuit boards 11, 12 can be electrically integrated with each other by using the connection pins 21 as electrically conducting paths.

When the pin header 2 of the embodiment is inserted into the first circuit board 11, moreover, the one ends of the projection holders 24 butt against the first circuit board 11, whereby the plurality of connection pins 21 fixed to the pin holder 22 can be prevented from being inserted into the through holes 11a more than necessary, and the other ends of the plurality of connection pins 21 can be held at the predetermined height with respect to the first circuit board 11. In the case where the other ends of the plurality of connection pins 21 are held at the predetermined height with respect to the first circuit board 11 as described above, when the second circuit board 12 is then placed on the insulating plate 13, the other ends of the projection holders 24 can be inserted by a predetermined length into the through holes 12a of the second circuit board 12.

Other Embodiments

Although, in the embodiment, the pin header 2 is applied to the first and second circuit boards 11, 12 which are housed in the electrical junction box 1, the invention is not particularly limited to the configuration. A configuration may be employed where the pin header is applied to a circuit board structure having the first circuit board 11 and the second circuit board 12 which is positioned while forming a predetermined gap with respect to the first circuit board 11. The pin header 2 of the embodiment is not limited to that which is applied to a circuit board structure where two circuit boards are connected to each other, and may be applied also to a circuit board structure where three or more circuit boards are connected to each other.

In the embodiment, the pin header 2 has the configuration where the pair of projection holders 24 are formed on the both end portions in the longitudinal direction of the holder body 23, respectively. The invention is not particularly limited to the configuration. The invention is applicable to a configuration where the pair of projection holders 24 are placed symmetrically about the center of the surface of the holder body 23 where the insertion holes 23a are formed. For example, the pair of projection holders 24 may be formed on the both end portions in the short direction at the center of the longitudinal direction of the holder body 23, respectively. According to the configuration, irrespective of whether either end portions of the connection pins 21 of the pin header 2 (the one ends of the connection pins 21 or the other ends of the connection pins 21) are inserted into the first circuit board 11, the butted positions of the projection holders 24 against the first circuit board 11 and the second circuit board 12 can be always set to predetermined positions. Also in the case where a plurality of projection holders 24 are formed on the holder body 23, similarly, a pair of projection holders 24 may be placed symmetrically about the center of the surface of the holder body 23 where the insertion holes 23a are formed.

Although, in the embodiment, the pair of projection holders 24 are formed in the pin header 2, the invention is not particularly limited to the configuration as far as the holder body 23 is fixed to be separated from the first circuit board 11 with a predetermined gap therebetween. For example, a configuration may be employed where one projection holder 24 having a first projecting portion 24a and second projecting portion 24b which extend downward and upward respectively is formed at a substantially center of the holder body 23.

Although, in the embodiment, the connection pins 21 are rod-like members which have a square sectional shape, and which linearly extend, the invention is not particularly limited to the configuration. The connection pins 21 may be rod-like members which have a circular or polygonal sectional shape, and which linearly extend.

In the embodiment, the connection pins 21 are pressingly inserted into the insertion holes 23a of the holder body 23 to be fixed to the holder body 23. However, the invention is not particularly limited to the configuration. The molding of the holder body 23 may be performed by insert molding in which the connection pins 21 are placed at predetermined positions, and then the holder body 23 is molded. When the holder body 23 and the connection pins 21 are integrally formed by such insert molding, the work of inserting the connection pins 21 can be omitted, and it is possible to simplify the whole work.

In the embodiment, the insertion end portions of the connection pins 21 which are inserted into the through holes 11a of the first circuit board 11 and the through holes 12a of the second circuit board 12 are soldered to be fixed to the first and second circuit boards 11, 12. However, the invention is not particularly limited to the configuration. For example, a configuration may be employed where each of the connection pins 21 is formed as a so-called press-fit pin in which the insertion end portion is formed into a hollow shape that can be outward swollen, and that can be repeatedly inward pressed. Alternatively, another configuration may be employed where so-called pin sockets that are electrically conductive tubular members to which the connection pins 21 can be fastened are formed in the first and second circuit boards 11, 12. When the insertion end portions of the connection pins 21 are formed as press-fit pins or pin sockets are disposed in the first and second circuit boards 11, 12, soldering is not necessary to be performed in the works of fixing the connection pins to the first and second circuit boards 11, 12. Therefore, it is possible to simplify the whole work.

The invention can be implemented in various ways without departing from the spirit and principal features thereof. Therefore, the above-described embodiments are merely simple examples in all aspects and are not to be interpreted in a restrictive manner. The scope of the invention is as indicated in the claims and is in no way restricted to the text of the specification. Furthermore, all modifications, various changes, substitution, and reformulation which fall a range equivalent to the scope of the claims are covered by the scope of the invention.

REFERENCE SIGNS LIST

1 ... electrical junction box
11 ... first circuit board, 11a ... through hole, 12 ... second circuit board, 12 ... through hole, 12b ... circuit board terminal, 12c ... circuit board terminal, 12d ... circuit board terminal, 12e ... terminal mounting plate, 13 ... insulating plate, 13a ... cutaway portion, 14 ... lower cover, 14a ... supporting projection, 14b ... engaged portion, 15 ... upper cover, 15a ... connector housing portion, 15b ... fuse housing portion, 15c ... relay housing portion, 15d ... engaging portion, 2 ... pin header
21 ... connection pin, 22 ... pin holder, 23 ... holder body, 23a ... insertion hole, 24 ... projection holder, 24a ... first projecting portion, 24b ... second projecting portion

What is claimed is:
1. A pin header including:
a plurality of connection pins that includes one end to be connected to a first circuit board and the other end to be connected to a second circuit board which is positioned to form a given gap between the first circuit board and the second circuit board; and
a pin holder that includes:
a holder body which holds centers of side faces of the plurality of connection pins; and
a projection holder which includes a first projecting portion projecting from the holder body toward a side of the one end of the connection pins, and a second projecting portion projecting from the holder body toward a side of the other end of the connection pins wherein a projection length of the first projecting portion is equal to a projection length of the second projecting portion, wherein the first projecting portion and the second projection portion project from a portion of the holder body which is provided outwardly from the plurality of connection pins, wherein the first projecting portion and the second projection portion have a smaller width respectively than a width of the holder body, and wherein at least one of the connection pins has a projection length which is longer than a projection length of the first projecting portion and the second projection portion respectively.

2. The pin header according to claim 1, wherein the pin holder includes a plurality of the projection holders, the holder body includes insertion holes into which the connection pins are inserted, and the projection holders are placed symmetrically about a center of a surface of the holder body where the insertion holes are formed.

3. The pin header according to claim 1, wherein end portions of the first projecting portion and the second projecting portion are formed into a spherical shape.

4. The pin header according to claim 2, wherein end portions of the first projecting portion and the second projecting portion are formed into a spherical shape.

5. The pin header according to claim 1, wherein the end portions of the first projecting portion are fixed to the first circuit board in point contact.

6. The pin header according to claim 2, wherein the end portions of the first projecting portion are fixed to the first circuit board in point contact.

7. The pin header according to claim 3, wherein the end portions of the first projecting portion are fixed to the first circuit board in point contact.

8. The pin header according to claim 4, wherein the end portions of the first projecting portions are fixed to the first circuit board in point contact.

* * * * *